AUTOMATIC FREQUENCY CONTROL
Filed Dec. 28, 1953
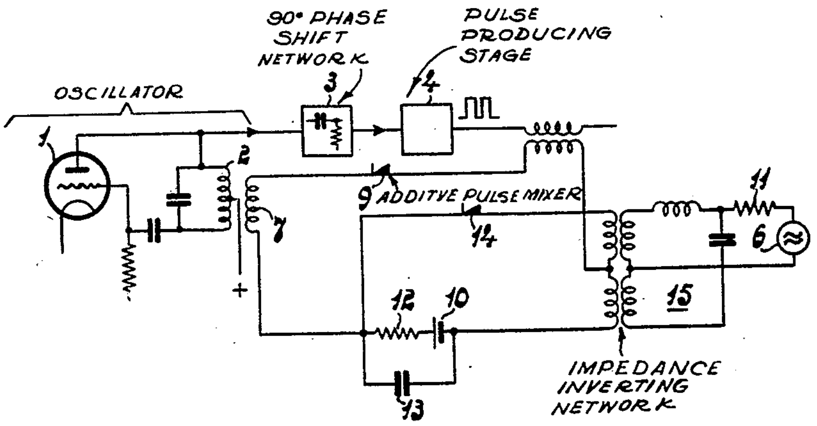
INVENTORS
JOHANNES ENSINK
WILLEM HERMES
BY [signature]
AGENT 2,794,919
Patented June 4, 1957

2,794,919

AUTOMATIC FREQUENCY CONTROL

Johannes Ensink and Willem Hermes, Hilversum, Netherlands, assignors, by mesne assignments, to North American Philips Company, Inc., New York, N. Y., a corporation of Delaware Application December 28, 1953, Serial No. 400,506

Claims priority, application Netherlands January 17, 1953

3 Claims. (Cl. 250—36)

This invention relates to an improvement in a circuit-arrangement as described in U. S. Patent No. 2,752,497, issued June 26, 1956.

The invention accordingly relates to an improvement in a circuit-arrangement for developing an electrical oscillation controlled by a control oscillation and having a frequency lower than that of the control oscillation, comprising an oscillator having regenerative feedback, a pulse stage converting the oscillations provided by the oscillator into pulsatory oscillations and an additive pulse mixer comprising at least one rectifier and a threshold voltage source and having the output pulses of the pulse stage and the control oscillation supplied to it, the output pulses of the pulse mixer being supplied with a phase shift of about 90° with respect to the voltage across the frequency-determining circuit of the oscillator back to the frequency-determining circuit.

The object of the improvement is to widen in such a circuit-arrangement the "holding range," that is the maximum relative frequency deviation which the resonance frequency of the frequency-determining circuit of the oscillator can exhibit with respect to the frequency of the electrical oscillation developed. It has been found that the holding range becomes smaller in accordance with an increase in the internal impedance of the control oscillation source or the said threshold voltage source. According to a principle underlying the invention, this is attributable to the fact that, when the said relative frequency deviation increases, on the one hand the amplitude of the control oscillation decreases and on the other hand the threshold voltage increases, so that the largest available amplitude of the pulses supplied to the frequency-determining circuit of the oscillator becomes smaller.

According to the invention, the improvement consists in that the control oscillation source is connected to the said threshold voltage source by way of a rectifier which counteracts voltage variations in the control oscillation and the threshold voltage.

In order that the invention may be readily carried into effect, will now be described with reference to the accompanying drawing showing, by way of example, one embodiment thereof.

The oscillation to be developed is obtained by means of a regenerative feedback oscillator comprising a tube 1 which is connected, for example, as a Hartley-oscillator and comprises a frequency-determining oscillatory circuit 2. Said oscillation is supplied by way of a network 3 shifting it in phase by approximately 90° and a pulse producing stage 4, together with a control oscillation provided by a source 6, to an additive pulse mixer constituted by a rectifier 9 and a threshold voltage source 10, so that pulses shifted in phase by approximately 90° are supplied by way of a coupling winding 7 to the frequency-determining circuit 2 of the oscillator 1, 2, the amplitude of the said pulses being a measure of the phase relation between the output pulses of the pulse stage 4 and the control oscillation of the source 6 and the pulses bringing about a determined frequency relation between the developed oscillation and the control oscillation. The threshold voltage source 10 insures that only that part of the sum of the control oscillation and the pulses which exceeds the threshold voltage will become operative in the control of the oscillator 1, 2.

The more the frequency of the oscillations developed by the oscillator 1, 2, which frequency is thus determined by the control oscillation of the source 6, differs from the resonance frequency of the circuit 2, the greater is the amplitude of the pulses which must be supplied to the winding 7. Said pulses constitute a load on the source 6, so that the control oscillation supplied to the circuit 9, 7, 10 decreases with larger amplitudes of the pulses due to the internal impedance 11 of the source 6. The said pulses furthermore traverse the internal impedance 12 of the threshold voltage source 10, which impedance 12 may be bridged by a decoupling capacitor 13, but the direct-current component of the said pulses in case of comparatively large amplitudes of the pulses then still causes an increase of the total threshold voltage set up across the elements 10—12.

Consequently, the two internal impedances 11 and 12 contribute to a decrease in the amplitude of the pulses supplied to the winding 7 and hence in the holding range of the circuit-arrangement.

According to the invention, a rectifier 14 is connected between the control oscillation source 6 and the threshold voltage source 10 and feeds the control oscillation to the capacitor 13 thereby producing on the capacitor 13 a voltage charge with a polarity which counteracts the voltage variations of the two sources 6, 11 and 10, 12. This results in the holding range of the circuit-arrangement being widened, so that there is a smaller chance that the oscillation developed by the oscillator 1, 2 may exhibit an unwanted frequency relation with respect to the control oscillation.

In order to develop a plurality of electrical oscillations controlled by the same control oscillation source 6, the source 6 may advantageously be coupled, as previously suggested, by way of an impedance-inverting network 15 to the oscillator 1, 2 and to similar oscillators (not shown). As shown in the drawing, the network 15 comprises a transformer having tapped primary and secondary windings, and an inductor and a capacitor connected in series across the primary winding, the control oscillation source 6 being connected between the primary tap and the junction of the inductor and capacitor. One end of the secondary winding is connected to the rectifier 14, the other end thereof is connected to the threshold voltage source 10, and the tap thereof is coupled to the pulse producing stage 4 and the additive pulse mixer rectifier 9. If desired, a second transformer may be provided, as shown, having a primary winding connected to the pulse producing stage 4 and a secondary winding connected between the rectifier 9 and the secondary tap of the network 15.

What is claimed is:

1. A circuit for producing a controlled oscillation, comprising a regenerative feedback oscillator having a frequency-determining circuit, a pulse producing stage connected to receive said oscillation and convert said oscillation into electrical pulses, a control oscillation source having an internal impedance, an additive pulse mixer comprising at least one rectifier and a threshold voltage source having an internal impedance, means connected to feed said electrical pulses and said control oscillation to said mixer, said threshold voltage source being connected to said rectifier to cause the output signal of said mixer to comprise pulses which are the part of the sum of said pulses and said control oscillation which exceeds the value of said threshold voltage, means connected to cause the phase of said output signal to be shifted about 90° with respect to the signal voltage across said frequency-determining circuit, means connected to feed said output signal to said frequency-determining circuit, and means for increasing the holding range of said oscillation circuit, said last-named means comprising a second rectifier connected to feed said control oscillation to said threshold voltage source thereby producing in said internal impedance a voltage with a polarity which counteracts the voltage variations caused by the internal impedances of said control oscillation source and said threshold voltage source.

2. A circuit in accordance with claim 1, including an impedance-inverting network connected to couple said control oscillation source to said mixer and to said second rectifier and comprising a transformer having tapped primary and secondary windings, and an inductor and a capacitor connected in series across said primary winding, said control oscillation source being connected between said primary tap and the junction of said inductor and said capacitor, an end of said secondary winding being connected to a terminal of said second rectifier, the remaining end of said secondary winding being connected to a terminal of said threshold voltage source, and means connecting the tap on said secondary winding to a terminal of said first-named rectifier.

3. A circuit in accordance with claim 1, including a decoupling capacitor connected across said threshold voltage source.

References Cited in the file of this patent

UNITED STATES PATENTS

| | | |
|---|---|---|
| 2,574,482 | Hugenholtz | Nov. 13, 1951 |
| 2,676,259 | Hansen | Apr. 20, 1954 |
| 2,676,262 | Hugenholtz | Apr. 20, 1954 |